United States Patent [19]

Throngnumchai et al.

[11] Patent Number: 4,963,970
[45] Date of Patent: Oct. 16, 1990

[54] VERTICAL MOSFET DEVICE HAVING PROTECTOR

[75] Inventors: Kraisorn Throngnumchai; Koichi Murakami, both of Yokosuka, Japan

[73] Assignee: Nissan Motor Company, Limited, Yokohama, Japan

[21] Appl. No.: 267,886

[22] Filed: Jan. 4, 1989

[30] Foreign Application Priority Data

Nov. 6, 1987 [JP] Japan .................................. 62-279099

[51] Int. Cl.$^5$ .............................................. H01 29/78
[52] U.S. Cl. ................................ 357/23.4; 357/23.13; 357/59; 357/15
[58] Field of Search ................... 357/23.4, 23.13, 59.6, 357/59 K, 59 A, 23.1, 41, 15

[56] References Cited

U.S. PATENT DOCUMENTS 4,492,974  1/1985  Yoshida et al. ........................ 357/13

FOREIGN PATENT DOCUMENTS 0215493   3/1987  European Pat. Off. ......... 357/23.13
58-84461   5/1983  Japan ................................. 357/23.13
58-223369 12/1983  Japan ................................. 357/23.13
60-258967 12/1985  Japan .
63-81984   4/1988  Japan ...................................... 357/13
1114077    5/1989  Japan ................................. 357/23.13

Primary Examiner—Andrew J. James
Assistant Examiner—Dang Xuân Hung
Attorney, Agent, or Firm—Foley & Lardner, Schwartz, Jeffery, Schwaab, Mack, Blumenthal & Evans

[57] ABSTRACT

A vertical MOSFET device including a semiconductor layer having a first conductivity type, in which a base region having a second conductivity type is formed in the semiconductor layer, and a source region having the first conductivity type is formed in the base region, in which a gate electrode is formed at least on the above described base region via an insulating gate film to form a channel between the semiconductor layer and the source region, and a protector having PN or Schottky junction, which is formed between the source region and the gate electrode and is thermally contacted with at least one of the other members.

12 Claims, 3 Drawing Sheets

VERTICAL MOSFET DEVICE HAVING PROTECTOR

BACKGROUND OF THE INVENTION

1. Field of the Invention

The present invention relates to a vertical MOSFET device having a protector for preventing its breakdown due to heat increase or the like.

2. Description of the Prior Art

In FIG. 1, there is shown a conventional vertical MOSFET device, as disclosed in Japanese Patent Laid-Open Specification No. 60-258967. In this case, an n-type high resistance epitaxial layer 12 is grown on an n+-type low resistance substrate 11, and p-type base region 13 having a conductivity type different from that of the epitaxial layer 12 is formed in an upper surface area thereof. An n+-type source region 14 having the same conductivity type as that of the epitaxial layer 12 is formed in a central upper surface area of the p-type base region 13, and a p+-type base contact region 15 is formed in the left side surface area of the p-type base region 13. An insulating gate film 16 is formed on the surfaces of the right side of the epitaxial layer 12, the p-type base region 13 and the overlapping part of the source region 14. A gate electrode 17 is then formed over the entire surface of the insulating gate film 16. A source electrode 18 is formed extending over the partial surfaces of the n+-type source region 14 and the p+-type base contact region 15. The gate electrode 17, the source electrode 18 and the semiconductor substrate 11 are connected to a gate terminal G, a source terminal S and a drain terminal D, respectively.

There is shown in FIG. 2 an area of safety operation (ASO) of the conventional vertical MOSFET device shown in FIG. 1. The ASO is defined by three characteristic lines 21, 22 and 23 which represent the limitations by the maximum current, the maximum consumption power and the maximum voltage, respectively.

In this embodiment, when an overload such a short circuit or the like is applied to the MOSFET device, an overcurrent flows in the MOSFET device beyond its safety operation rating to bring about a breakdown or destruction of the MOSFET device due to its temperature rise.

In order to prevent such a breakdown of an element or device due to the overload, a particular external protecting circuit is additionally required, which brings about cost increase and inconvenience for handling the element or device.

SUMMARY OF THE INVENTION

Accordingly, it is an object of the present invention to provide a vertical MOSFET device having a protector, free from the aforementioned defects and disadvantages of the prior art, which is capable of preventing a breakdown of the vertical MOSFET device due to its temperature rise or the like and which is simple in structure.

In accordance with one aspect of the present invention, there is provided a vertical MOSFET device, comprising a semiconductor layer having a first conductivity type, a base region having a second conductivity type, formed in a surface portion of the semiconductor layer, a source region having the first conductivity type, formed in the base region, a gate electrode formed at least on the base region via an insulating gate film interposed therebetween to form a channel between the semiconductor layer and the source region, and a protector having one of a PN junction and a Schottky junction, which is formed between the source region and the gate electrode and thermally contacts at least one of the other members.

DESCRIPTION OF THE PREFERRED EMBODIMENTS

Figure 3:
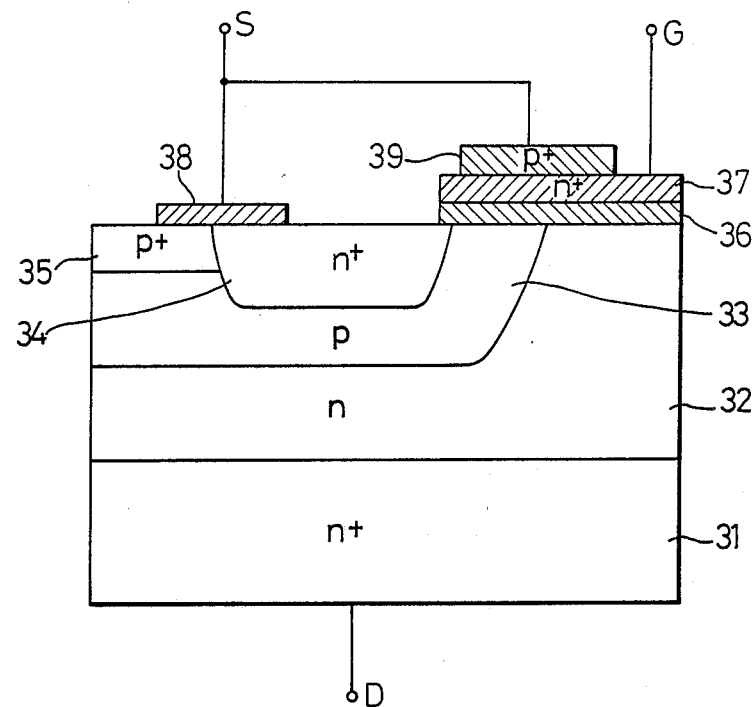
FIG. 3 is a longitudinal cross sectional view of one embodiment of a vertical MOSFET device according to the present invention.
Figure 4:
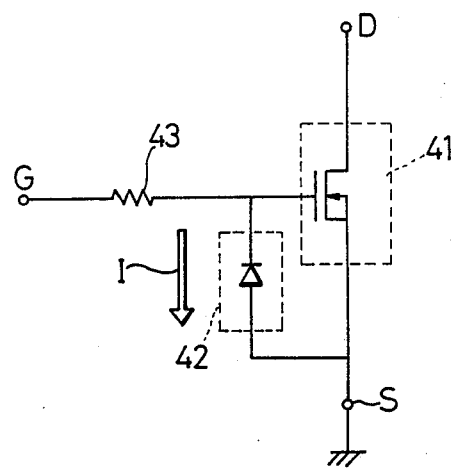
FIG. 4 is a circuit representation of an equivalent circuit of the vertical MOSFET device of FIG. 3.

Referring now to the drawings, there is shown in FIGS. 3 and 4 the first embodiment of a vertical MOSFET device having a protector according to the present invention.

In the drawings, an n-type high resistance epitaxial layer 32 is grown on an n+-type low resistance substrate 31 such as a silicon semiconductor substrate, and a p-type base region 33 having a conductivity type different from that of the epitaxial layer 32 is formed in an upper surface area thereof. An n+-type source region 34 having the same conductivity type as that of the epitaxial layer 32 is formed in a central upper surface area of the p-type base region 33, and a p+-type base contact region 35 is formed in the left side surface area of the p-type base region 33. An insulating gate film 36 is formed over the surfaces of the right side of the n-type epitaxial layer 32 and the p-type base region 33, overlapping into part of the source region 34, and an n+-type polycrystalline film 37 having the same conductivity type as that of the n+-type source region 34 is formed as a gate electrode on the entire surface of the insulating gate film 6. A p+-type polycrystalline silicon film 39 having a conductivity type different from that of the polycrystalline film 37 is formed thereon to constitute a PN junction therebetween. A source electrode 38 is formed extending over the partial surfaces of the n+-type source region 34 and the p+-type base contact region 35, and is electrically connected to the polycrystalline silicon film 39.

In FIG. 4, there is shown an equivalent circuit of the vertical MOSFET device described above, including a vertical MOSFET 41 comprised of the components 31 to 38, a protector diode 42 which is integrally attached to the MOSFET 41 and is composed of the polycrystalline silicon films 37 and 39 having the PN junction therebetween, and an input resistor 43 (not shown in FIG. 3) for restricting a gate voltage.

Then, the operation of the vertical MOSFET device having the protector described above will be described.

As shown in FIG. 4, since the protector diode 42 comprised of the polycrystalline silicon films 37 and 39 is thermally contacted with the vertical MOSFET 41, when the temperature of the MOSFET 41 is raised due to the overload or the like, the junction temperature of the protector diode 42 rises, and the leakage current I flowing through the protector diode 42 increases exponentially. Hence, the gate voltage of the MOSFET 41 is reduced, and the current flowing the the MOSFET 41 and the consumption power therein are automatically reduced, resulting in that the temperature rise of the MOSFET 41 is limited and the MOSFET 41 is protected from the breakdown due to the temperature rise.

In this embodiment, the protector diode 42 is provided integrally on the gate electrode portion, and the area and size of the protector diode 42 can be diminished as compared with an external protecting circuit attached to the conventional MOSFET device. Further, in this embodiment, the sensitivity to the temperature rise can be also largely improved as compared with the conventional MOSFET device.

Figure 1:
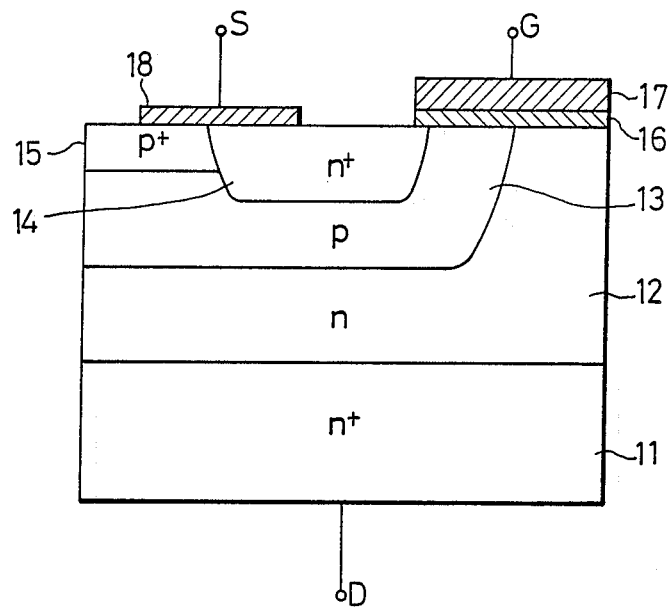
FIG. 1 is a longitudinal cross sectional view of a conventional vertical MOSFET device.
Figure 2:
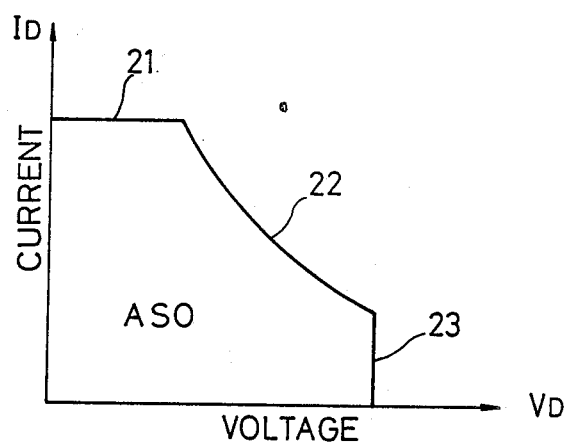
FIG. 2 is a graphical representation showing an area of safety operation of the conventional MOSFET device of FIG. 1.

A metallic material such as aluminum can be used instead of the polycrystalline silicon film of the first embodiment shown in FIG. 1. In such a case, the metallic electrode and the polycrystalline silicon film 39 constitute a Schottky junction therebetween with the same effects and results as those of the first embodiment.

Figure 5:
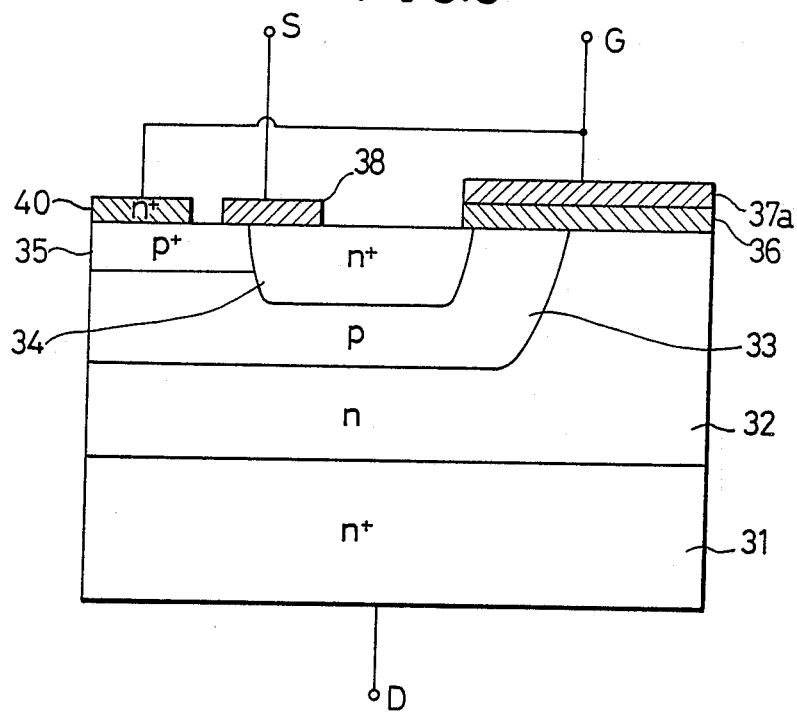
FIG. 5 is a longitudinal cross sectional view of another embodiment of a vertical MOSFET device according to the present invention.

In FIG. 5, there is shown the second embodiment of the vertical MOSFET device according to the present invention, having the same construction as that of the prior art described above, except the base contact region. That is, an n+-type polycrystalline silicon film 40 having a conductivity type different from that of the p+-type base contact region 35 is formed thereon separate from the source electrode 38. The polycrystalline silicon film 40 is electrically connected to the gate electrode 37a.

In this embodiment, the base contact region 35 and the polycrystalline silicon film 40 constitute the protector diode 42 which functions in the same manner as that of the first embodiment with the same effects and advantages as those obtained in the first embodiment.

Figure 6:
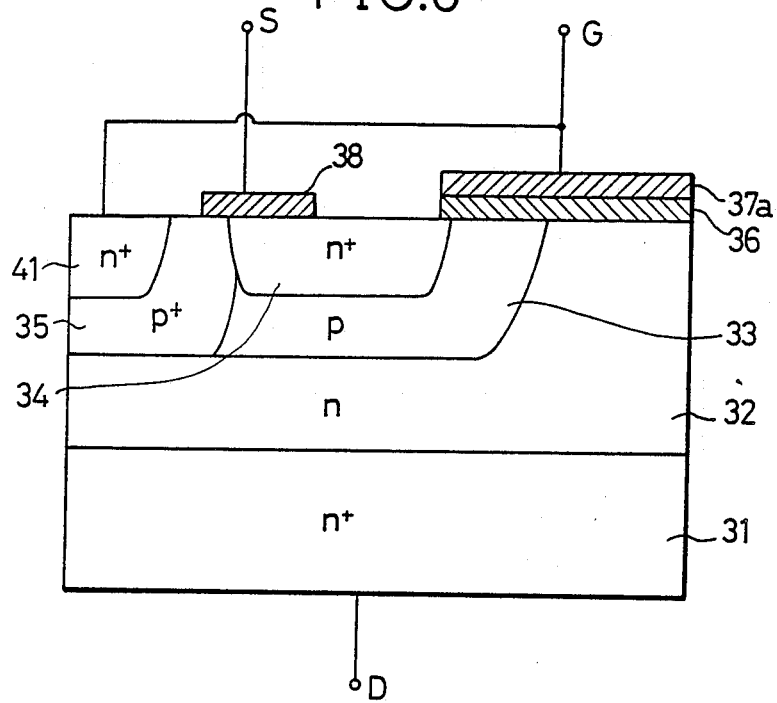
FIG. 6 is a longitudinal cross sectional view of still another embodiment of a vertical MOSFET device according to the present invention.

In FIG. 6, there is shown the third embodiment of the vertical MOSFET device according to the present invention, having the same construction as that of the second embodiment described above, except that the p+-type base contact region 35 is formed more deeply through the p-type base region 33 to contact the n-type epitaxial layer 32, and an n+-type region 41 is formed in the surface area of the base contact region 35 instead of the n+-type polycrystalline silicon film 40 of the second embodiment. In this embodiment, the n+-type region 41 and the base contact region 35 constitute a PN junction protector diode instead of the protector diode composed of the polycrystalline silicon film 40 and the base contact region 35 in the second embodiment. Hence, in this embodiment, the same effects and results as those of the second embodiment can be obtained. In this case, the protector forming region 41 can be prepared along with the source region 34 in one step, and thus the vertical MOSFET device can be readily produced without providing particular masking and processing steps.

Further, in the preferred embodiments of the present invention, in addition to the protection of the vertical MOSFET device from the breakdown due to its excessively high temperature, by controlling the breakdown voltage of the protector diode inserted between the gate and source electrodes, the insulating gate film of the vertical MOSFET device can be protected from the electrostatic destruction in the same time. In this time, the protector diode 42 acts as a Zener diode for limiting the gate voltage, and the electrostatic charge flows down into the source through the Zener diode, thereby reducing the breakdown of the insulating gate film due to the static electricity.

What is claimed is:

1. A vertical MOSFET device, comprising:
a semiconductor layer of a first conductivity type;
a base region of a second conductivity type formed in a surface area of the semiconductor layer;
a source region of the first conductivity type formed in the base region;
a gate electrode formed at least on the base region and the semiconductor layer, via an insulating gate film interposed therebetween, to form a channel between the semiconductor layer and the source region, the gate electrode comprising a polycrystalline silicon film of the first conductivity type; and
a protector formed of a PN junction, the protector being formed between the source region and the gate electrode, the protector comprising the gate electrode, in contact with the insulating gate film, and a polycrystalline silicon film of the second conductivity type, the protector thermally contacting at least the base region and the semiconductor layer.

2. A vertical MOSFET device, comprising:
a semiconductor layer of a first conductivity type;
a base region of a second conductivity type formed in a surface area of the semiconductor layer;
a source region of the first conductivity type formed in the base region;
a gate electrode formed at least on the base region and the semiconductor layer, via an insulating gate film interposed therebetween, to form a channel between the semiconductor layer and the source region, the gate electrode comprising a polycrystalline silicon film of the first conductive type; and
a protector formed of a Schottky junction, the protector being formed between the source region and the gate electrode, the protector comprising the gate electrode, in contact with the insulating gate film, and a polycrystalline silicon film of the second conductivity type, the protector thermally contacting at least the base region and the semiconductor layer.

3. A vertical MOSFET device, comprising:
a semiconductor layer of a first conductivity type;
a base region of a second conductivity type formed in a surface area of the semiconductor layer;
a source region of the first conductivity type formed in the base region;
a gate electrode formed at least on the base region and the semiconductor layer, via an insulating gate film interposed therebetween, to form a channel between the semiconductor layer and the source region, the gate electrode comprising a metal film; and
a protector formed of a PN junction, the protector being formed between the source region and the gate electrode, the protector comprising the gate electrode, in contact with the insulating gate film, and a polycrystalline silicon film of the second conductivity type, the protector thermally contacting at least the base region and the semiconductor layer.

4. A vertical MOSFET device, comprising:
a semiconductor layer of a first conductivity type;
a base region of a second conductivity type formed in a surface area of the semiconductor layer;
a source region of the first conductivity type formed in the base region;
a gate electrode formed at least on the base region and the semiconductor layer, via an insulating gate film interposed therebetween, to form a channel between the semiconductor layer and the source region, the gate electrode comprising a metal film; and
a protector formed of a Schottky junction, the protector being formed between the source region and the gate electrode, the protector comprising the gate electrode, in contact with the insulating gate film, and a polycrystalline silicon film of the second conductivity type, the protector thermally contacting at least the base region and the semiconductor layer.

5. A vertical MOSFET device, comprising:
a semiconductor layer of a first conductivity type;
a base region of a second conductivity type formed in a surface portion of the semiconductor layer;
a source region of the first conductivity type formed in the base region;
a gate electrode formed at least on the base region and the semiconductor layer, via an insulating gate film interposed therebetween, to form a channel between the semiconductor layer and the source region; and
a protector having a PN junction, the protector being formed between the source region and the gate electrode, the protector comprising a base contact region of the second conductivity type, formed in the base region, and a polycrystalline silicon film of the first conductivity type formed on the base contact region, the protector thermally contacting the base region formed in the semiconductor layer.

6. A vertical MOSFET device, comprising:
a semiconductor layer of a first conductivity type;
a base region of a second conductivity type formed in a surface portion of the semiconductor layer;
a source region of the first conductivity type formed in the base region;
a gate electrode formed at least on the base region and the semiconductor layer, via an insulating gate film interposed therebetween, to form a channel between the semiconductor layer and the source region; and
a protector having a Schottky junction, the protector being formed between the source region and the gate electrode, the protector comprising a base contact region of the second conductivity type, formed in the base region, and a polycrystalline silicon film of the first conductivity type formed on the base contact region, the protector thermally contacting the base region formed in the semiconductor layer.

7. A vertical MOSFET device, comprising:
a semiconductor layer of a first conductivity type;
a base region of a second conductivity type formed in a surface portion of the semiconductor layer;
a source region of the first conductivity type formed in the base region;
a gate electrode formed at least on the base region and the semiconductor layer, via an insulating gate film interposed therebetween, to form a channel between the semiconductor layer and the source region; and
a protector having a PN junction, the protector being formed between the source region and the gate electrode, the protector comprising a base contact region of the second conductivity type, formed in the base region, and a metal film formed on the base contact region, the protector thermally contacting the base region formed in the semiconductor layer.

8. A vertical MOSFET device, comprising:
a semiconductor layer of a first conductivity type;
a base region of a second conductivity type formed in a surface portion of the semiconductor layer;
a source region of the first conductivity type formed in the base region;
a gate electrode formed at least on the base region and the semiconductor layer, via an insulating gate film interposed therebetween, to form a channel between the semiconductor layer and the source region; and
a protector having a Schottky junction, the protector being formed between the source region and the gate electrode, the protector comprising a base contact region of the second conductivity type, formed in the base region, and a metal film formed on the base contact region, the protector thermally contacting the base region formed in the semiconductor layer.

9. A vertical MOSFET device, comprising:
a semiconductor layer of a first conductivity type;
a base region of a second conductivity type formed in a surface portion of the semiconductor layer;
a source region of the first conductivity type formed in the base region;
a gate electrode formed on at least the base region and the semiconductor layer, via an insulating gate film interposed therebetween, to form a channel between the semiconductor layer and the source region; and
a protector having a PN junction, the protector being formed between the source region and the gate electrode, the protector comprising a base contact region of the second conductivity type formed in the base region and a region of a first conductivity type formed on the base contact region, the protector thermally contacting the base region formed in the semiconductor layer.

10. A vertical MOSFET device, comprising:
a semiconductor layer of a first conductivity type;
a base region of a second conductivity type formed in a surface portion of the semiconductor layer;
a source region of the first conductivity type formed in the base region;
a gate electrode formed on at least the base region and the semiconductor layer, via an insulating gate film interposed therebetween, to form a channel between the semiconductor layer and the source region; and
a protector having a PN junction, the protector being formed between the source region and the gate electrode, the protector comprising a base contact region of the second conductivity type formed in the base region and a metal film formed on the base contact region, the protector thermally contacting the base region formed on the semiconductor layer.

11. A vertical MOSFET device, comprising:
a semiconductor layer of a first conductivity type;

a base region of a second conductivity type formed in a surface portion of the semiconductor layer;

a source region of the first conductivity type formed in the base region;

a gate electrode formed on at least the base region and the semiconductor layer, via an insulating gate film interposed therebetween, to form a channel between the semiconductor layer and the source region; and a protector having a Schottky junction, the protector being formed between the source region and the gate electrode, the protector comprising a base contact region of the second conductivity type formed in the base region and a region of a first conductivity type formed on the base contact region, the protector thermally contacting the base region formed in the semiconductor layer.

12. A vertical MOSFET device, comprising:

a semiconductor layer of a first conductivity type;

a base region of a second conductivity type formed in a surface portion of the semiconductor layer;

a source region of the first conductivity type formed in the base region;

a gate electrode formed on at least the base region and the semiconductor layer, via an insulating gate film interposed therebetween, to form a channel between the semiconductor layer and the source region; and a protector having a Schottky junction, the protector being formed between the source region and the gate electrode, the protector comprising a base contact region of the second conductivity type formed in the base region and a metal film formed on the base contact region, the protector thermally contacting the base region formed in the semiconductor layer.

* * * * *